(12) United States Patent
Shin et al.

(10) Patent No.: US 11,072,727 B2
(45) Date of Patent: Jul. 27, 2021

(54) ADHESIVE MEMBER, DISPLAY DEVICE INCLUDING THE SAME AND METHOD OF MANUFACTURING THE SAME

(71) Applicant: Samsung Display Co., Ltd., Yongin-si (KR)

(72) Inventors: Heonjung Shin, Hwaseong-si (KR); Hye-Jin Oh, Asan-si (KR); Jeoungsub Lee, Seoul (KR); Min-Hoon Choi, Seoul (KR); Kyungtae Kim, Asan-si (KR); Boa Kim, Icheon-si (KR); Sanghoon Kim, Hwaseong-si (KR); Sang-Il Park, Yongin-si (KR); Hyunjoon Oh, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 136 days.

(21) Appl. No.: 15/832,521

(22) Filed: Dec. 5, 2017

(65) Prior Publication Data

US 2018/0203321 A1 Jul. 19, 2018

(30) Foreign Application Priority Data

Jan. 18, 2017 (KR) .................. 10-2017-0008510

(51) Int. Cl.
*C09J 7/00* (2018.01)
*H01L 51/52* (2006.01)
(Continued)

(52) U.S. Cl.
CPC ... *C09J 7/00* (2013.01); *C09J 7/10* (2018.01); *C09J 7/255* (2018.01); *C09J 7/29* (2018.01); *C09J 7/38* (2018.01); *G02F 1/133308* (2013.01); *H01L 51/5012* (2013.01); *H01L 51/5253* (2013.01); *C09J 2203/318* (2013.01); *C09J 2203/326* (2013.01); *C09J 2301/20* (2020.08); *C09J 2301/204* (2020.08);
(Continued)

(58) Field of Classification Search
CPC .............. G02F 1/133308; G02F 1/167; G02F 2001/133331; G02F 2202/28; C09J 7/255; C09J 7/29; C09J 7/10; C09J 7/38; C09J 2201/28; C09J 2201/36; C09J 2203/318; H01L 51/5253; H01L 51/5012; H01L 2251/5338; Y10T 428/14; Y10T 428/1481; Y10T 428/1486
See application file for complete search history.

(56) References Cited

U.S. PATENT DOCUMENTS 9,051,493 B2 * 6/2015 Bower ................. C09J 5/00
9,333,725 B2 * 5/2016 Chuang ............... C09J 5/06
(Continued)

FOREIGN PATENT DOCUMENTS

| KR | 10-2013-0119330 A | 10/2013 |
|---|---|---|
| KR | 10-2014-0137818 A | 12/2014 |
| KR | 10-2016-0032795 A | 3/2016 |

*Primary Examiner* — Patricia L. Nordmeyer
(74) *Attorney, Agent, or Firm* — Lewis Roca Rothgerber Christie LLP (57) ABSTRACT

An adhesive member for a display device is disclosed. The adhesive member may include an adhesive film configured to roll along a rolling axis. The adhesive film may include an adhesive portion including a plurality of adhesive lines. The plurality of adhesive lines may not be orthogonal to the rolling axis.

13 Claims, 8 Drawing Sheets

(51) Int. Cl.
*C09J 7/38* (2018.01)
*H01L 51/50* (2006.01)
*C09J 7/29* (2018.01)
*G02F 1/1333* (2006.01)
*C09J 7/25* (2018.01)
*C09J 7/10* (2018.01)

(52) U.S. Cl.
CPC ...... *C09J 2301/208* (2020.08); *C09J 2301/21* (2020.08); *G02F 1/133331* (2021.01); *G02F 2202/28* (2013.01); *H01L 2251/5338* (2013.01); *Y10T 428/14* (2015.01)

(56) References Cited

U.S. PATENT DOCUMENTS

2006/0159867 A1* 7/2006 O'Donnell ........ G02F 1/133308
428/1.5
2016/0137885 A1* 5/2016 Maier ........................ C09J 7/22
428/41.8

* cited by examiner

| | EMBODIMENT EXAMPLE1 | EMBODIMENT EXAMPLE2 | EMBODIMENT EXAMPLE3 | COMPARATIVE EXAMPLE1 | COMPARATIVE EXAMPLE2 |
|---|---|---|---|---|---|
| CONTACT AREA | 50% | | | | 100% (ENTIRE AREA) |
| INCLUDED ANGLE | 0° | 30° | 60° | 90° | — |
| IMMEDIATELY AFTER | | | | | |
| 24 HOURS AFTER | | | | | |

ADHESIVE MEMBER, DISPLAY DEVICE INCLUDING THE SAME AND METHOD OF MANUFACTURING THE SAME

CROSS-REFERENCE TO RELATED APPLICATION

This application claims priority to and the benefit of Korean Patent Application No. 10-2017-0008510, filed on Jan. 18, 2017 in the Korean Intellectual Property Office (KIPO), the entire content of which is incorporated herein by reference.

BACKGROUND

1. Field

Exemplary embodiments of the present disclosure relate to adhesive members. For example, exemplary embodiments relate to adhesive members, flexible display devices including the adhesive members, and methods of manufacturing the adhesive members.

2. Description of the Related Art

Recently, applications and uses of a flexible display device that is bendable, rollable, or foldable when in use or during manufacture have been expanding.
A display device may include a display member capable of displaying an image and a protective member protecting the display member. The display member and the protective member may be attached by an adhesive member. The adhesive member may include a pressure sensitive adhesive (PSA) that is a viscoelastic material. When mechanical stresses are applied to the viscoelastic material, creep deformation may occur.

SUMMARY

Embodiments of the present disclosure provide an adhesive member in which creep deformation may be decreased or substantially prevented.

Embodiments of the present disclosure provide a display device including an adhesive member in which creep deformation may be decreased or substantially prevented.

Embodiments of the present disclosure provide a method of manufacturing an adhesive member in which creep deformation may be decreased or substantially prevented.

In order to provide features of embodiments of the present disclosure described above, an adhesive member according to an exemplary embodiment may include an adhesive film configured to roll along a rolling axis. The adhesive film may include an adhesive portion including a plurality of adhesive lines. The plurality of adhesive lines may not be orthogonal to the rolling axis.

In an exemplary embodiment, included angles between the plurality of adhesive lines and the rolling axis may be in a range of about 0 degrees to about 30 degrees.

In an exemplary embodiment, the adhesive portion may include a pressure sensitive adhesive (PSA).

In an exemplary embodiment, a width of each of the plurality of adhesive lines may be in a range of about 10 micrometers (μm) to about 200 μm.

In an exemplary embodiment, an area of the adhesive portion may be in a range of about 10% to about 80% of an area of the adhesive film.

In an exemplary embodiment, the plurality of adhesive lines may define an elastic portion. The elastic portion may have a polygonal shape.

In an exemplary embodiment, the elastic portion may include an elastomer.

In an exemplary embodiment, a difference between a refractive index of the adhesive portion and a refractive index of the elastic portion may be less than about 0.1.

In an exemplary embodiment, each of the plurality of adhesive lines may include a first adhesive line parallel (e.g., substantially parallel) with the rolling axis, a second adhesive line that forms an acute angle with the rolling axis in a counterclockwise direction, and a third adhesive line that forms an acute angle with the rolling axis in a clockwise direction. The first adhesive line, the second adhesive line, and the third adhesive line may define an elastic portion.

In an exemplary embodiment, the elastic portion may have a honeycomb shape, a triangle shape, or a trapezoid shape.

In an exemplary embodiment, each of the plurality of adhesive lines may include a first adhesive line that forms an acute angle with the rolling axis in a counterclockwise direction, and a second adhesive line that forms an acute angle with the rolling axis in a clockwise direction. The first adhesive line and the second adhesive line may define an elastic portion.

In an exemplary embodiment, the elastic portion may have a diamond shape.

In an exemplary embodiment, the adhesive portion may include a first adhesive layer and a second adhesive layer disposed on at least one surface of the first adhesive layer. The second adhesive layer may have an adhesion greater than an adhesion of the first adhesive layer. An elastic resilience of the first adhesive layer may be greater than an elastic resilience of the second adhesive layer.

In an exemplary embodiment, a storage modulus of the first adhesive layer may be in a range of about $1.0 \times 10^4$ to about $1.0 \times 10^6$ at about 25° C. A loss tangent of the first adhesive layer may be in a range of about 0.3 to about 1.5 at about 25° C.

In an exemplary embodiment, an adhesion of the adhesive portion may be in a range of about 0.3 kgf/in to about 1.5 kgf/in.

In order to provide features of embodiments of the present disclosure described above, a display device according to an exemplary embodiment may include a display member configured to roll along a rolling axis, an adhesive member disposed on the display member, the adhesive member including an adhesive portion including a plurality of adhesive lines, and a protective member disposed on the adhesive member. The plurality of adhesive lines may not be orthogonal to the rolling axis.

In an exemplary embodiment, included angles between the plurality of adhesive lines and the rolling axis may be in a range of about 0 degrees to about 30 degrees.

In an exemplary embodiment, an area of the adhesive portion may be in a range of about 10% to about 80% of an area of the adhesive member.

In order to provide features of embodiments of the present disclosure described above, in a method of manufacturing an adhesive member according to an exemplary embodiment, adhesive may be applied on a release film. The adhesive may be patterned by using a molding roller to form an adhesive portion including a plurality of adhesive lines. The adhesive may be hardened. The plurality of adhesive lines may not be orthogonal to a rolling axis.

In an exemplary embodiment, a space in which the release film is exposed by patterning the adhesive may be filled with an elastic material to form an elastic portion.

The adhesive member according to exemplary embodiments of the present disclosure may include the adhesive portion including the plurality of adhesive lines, and the adhesive lines may not be orthogonal to the rolling axis. Therefore, the creep deformation may be decreased or substantially prevented.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Hereinafter, adhesive members, display devices including the adhesive members, and methods of manufacturing the adhesive members in accordance with exemplary embodiments of the present disclosure will be explained in more detail with reference to the accompanying drawings. The subject matter of the present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Figure 1A:
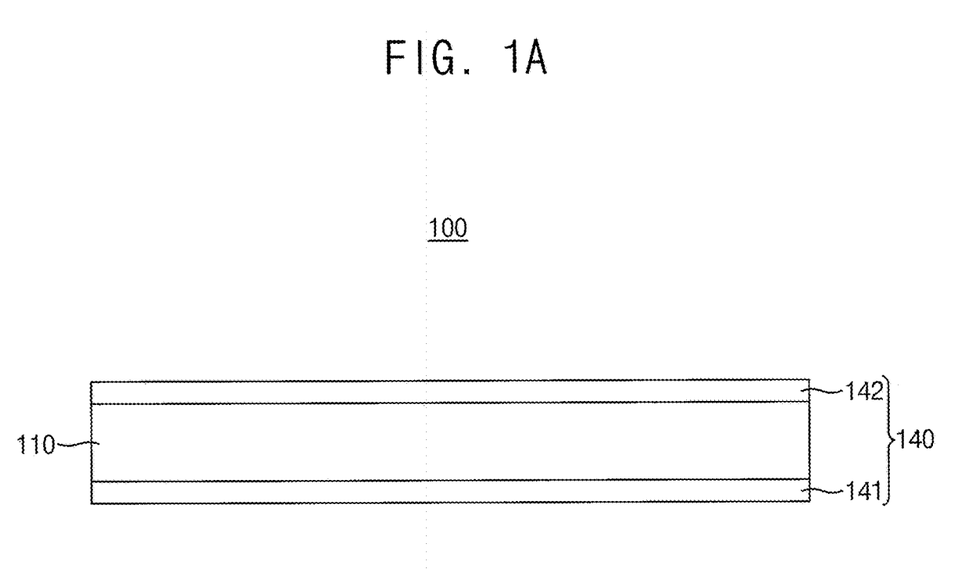
FIGS. 1A-1B are side views illustrating an adhesive member according to an exemplary embodiment.
Figure 1B:
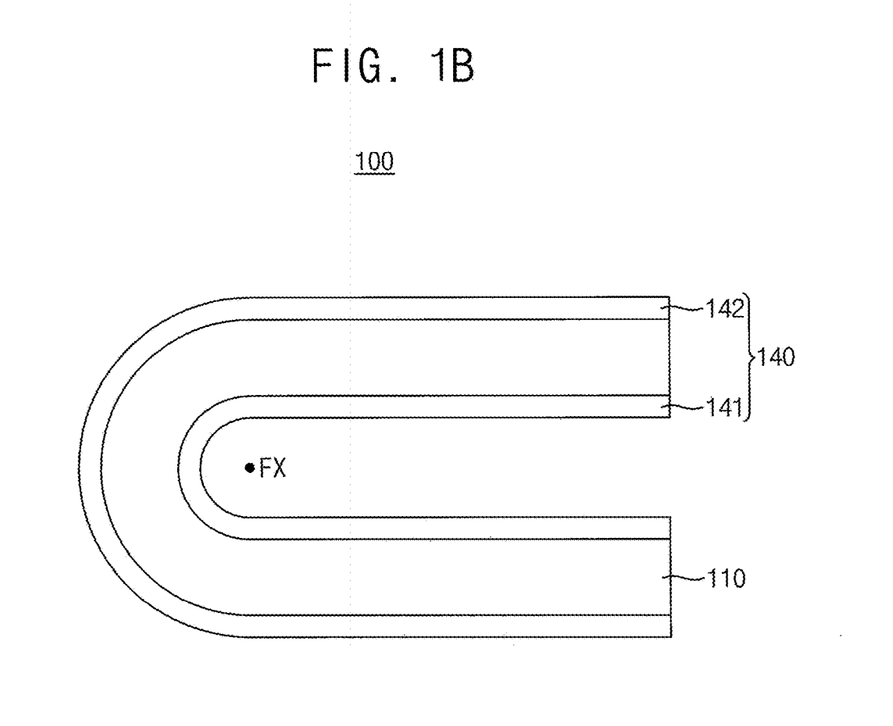

FIGS. 1A-1B are side views illustrating an adhesive member according to an exemplary embodiment. For example, FIG. 1A may illustrate an unrolled adhesive member, and FIG. 1B may illustrate a rolled adhesive member.

Referring to FIGS. 1A-1B, an adhesive member 100 according to an exemplary embodiment may include an adhesive film 110 and a release film 140.

The adhesive film 110 may have adhesion (e.g., may be adhesive). Thus, the adhesive film 110 may attach components (e.g., a display member, a protective member, a polarizing member, a touch sensing member, etc.) of a display device to each other.

The release film 140 may be disposed on at least one surface of the adhesive film 110. For example, the release film 140 may include a lower release film 141 disposed on a bottom surface of the adhesive film 110 and an upper release film 142 disposed on a top surface of the adhesive film 110.

The release film 140 may temporarily protect an adhesive surface of the adhesive film 110 from contaminants such as dust, debris, moisture, etc. The release film 140 may include a plastic film formed of polyimide (PI), polyethylene terephthalate (PET), polyethylene naphthalate (PEN), polyethersulfone (PES), nylon, polytetrafluoroethylene (PTFE), polyether ether ketone (PEEK), polycarbonate (PC), and/or polyarylate.

The release film 140 may serve as a type (or kind) of substrate. In an exemplary embodiment, when the adhesive member 100 is attached to a display device, the release film 140 may be removed. In another exemplary embodiment, when the release film 140 is formed of a transmissive material, the release film 140 may not be removed (e.g., may be retained on the adhesive film 110).

The adhesive member 100 may folded, rolled, or bent. When a display device is folded, rolled, or bent, the adhesive member 100 may be folded, rolled, or bent together with the display device. For example, the adhesive member 100 may be rolled along a rolling axis FX as illustrated in FIG. 1B.

Figure 2:
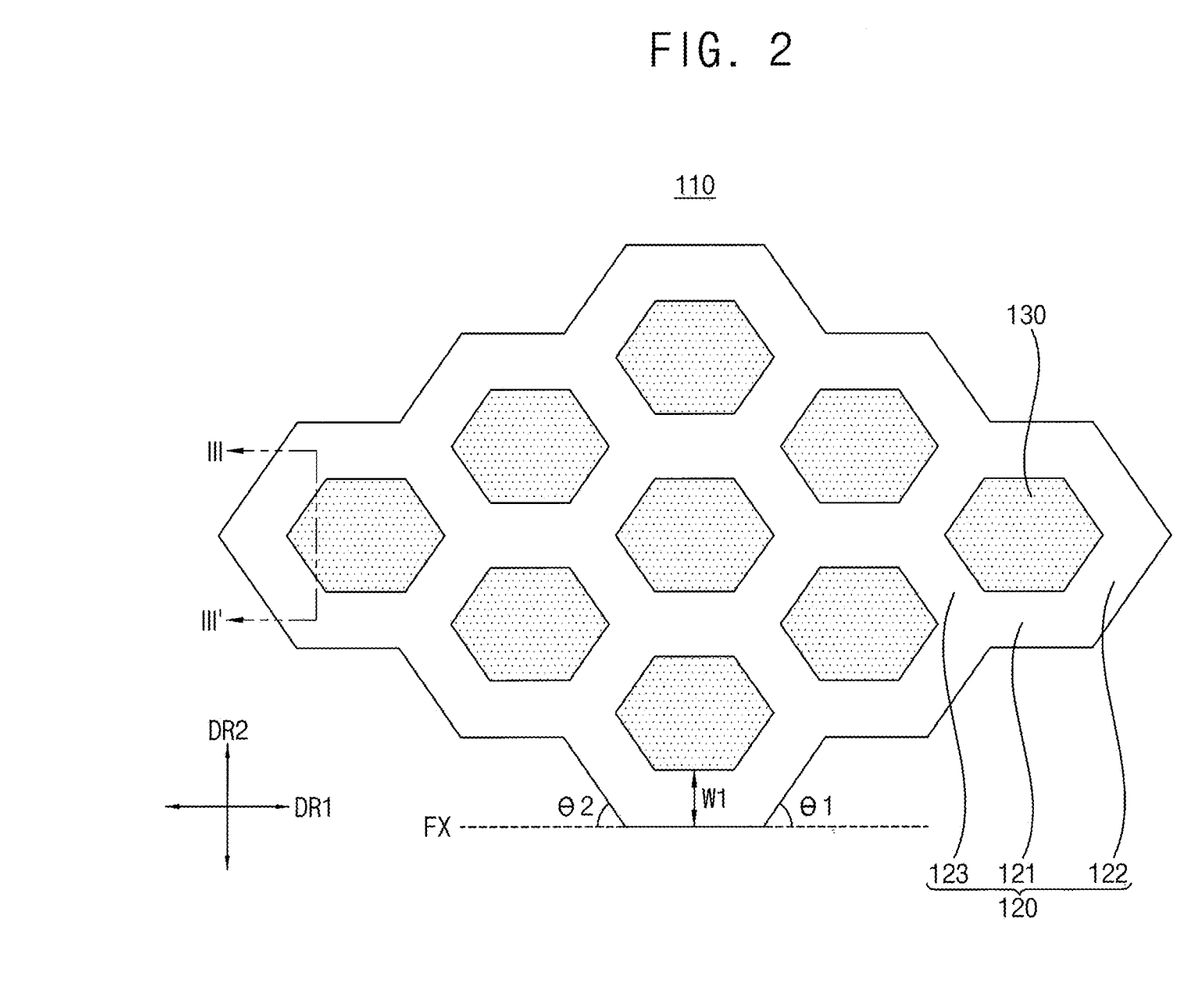
FIG. 2 is a plan view illustrating an adhesive film of an adhesive member according to an exemplary embodiment.

FIG. 2 is a plan view illustrating an adhesive film of an adhesive member according to an exemplary embodiment.

Referring to FIG. 2, the adhesive film 110 may include an adhesive portion 120 and an elastic portion 130. The adhesive film 110 may include one or more adhesive portions 120 and one or more elastic portions 130.

The adhesive portion 120 may serve to attach members disposed on a top surface and/or a bottom surface of the adhesive film 110 to the adhesive film 110. The adhesive portion 120 may be formed of a pressure sensitive adhesive (PSA). For example, the adhesive portion 120 may include acrylic based adhesives, silicon based adhesives, and/or urethane based adhesives.

In an exemplary embodiment, the adhesive portion 120 may have an adhesion greater than about 0.3 kgf/in. For example, the adhesion of the adhesive portion 120 may be in a range of about 0.3 kgf/in to about 1.5 kgf/in. When the adhesion of the adhesive portion 120 is greater than about 0.3 kgf/in, the adhesive member 100 may provide enough adhesion to the members disposed on the top surface and/or the bottom surface of the adhesive film 110.

The adhesive portion 120 may include a plurality of adhesive lines. The adhesive lines may extend along directions different from each other. For example, a first adhesive line may extend along a first direction, and second adhesive line may extend along a second direction different from the first direction. Included angles formed between the adhesive lines and the rolling axis FX may be less than 90 degrees. In other words, the adhesive lines may not be orthogonal to the rolling axis FX (e.g., the adhesive lines may extend along respective lines that do not form a 90 degree angle with the rolling axis FX). The adhesive lines may extend along a first direction DR1 parallel (e.g., substantially parallel) to the rolling axis FX, or may extend along a set or predetermined direction between the first direction DR1 and a second direction DR2, the second direction DR2 being orthogonal or substantially orthogonal to the rolling axis FX. However, the adhesive lines may not extend along the second direction DR2.

In an exemplary embodiment, the adhesive film 110 may include a plurality of adhesive portions 120 each including a plurality of adhesive lines. Each adhesive portion 120 may share at least one adhesive line with at least one adjacent adhesive portion 120.

In an exemplary embodiment, the adhesive portion 120 may include a first adhesive line 121, a second adhesive line 122, and a third adhesive line 123. The second adhesive line 122 may extend from one end of the first adhesive line 121. The third adhesive line 123 may extend from another end of the first adhesive line 121.

In an exemplary embodiment, the adhesive portion 120 may include six adhesive lines. For example, the adhesive portion 120 may include two first adhesive lines 121 opposite to each other, two second adhesive lines 122 opposite to each other, and two third adhesive lines 123 opposite to each other. Thus, a honeycomb shape may be formed inside the adhesive portion 120 surrounded (e.g., partially surrounded) by the six adhesive lines. For example, two adhesive portions 120 adjacent to each other may share one adhesive line.

Included angles formed between the first, second, and third adhesive lines 121, 122, and 123, and the rolling axis FX may be less than 90 degrees. In other words, the first, second, and third adhesive lines 121, 122, and 123 may not be orthogonal to the rolling axis FX. In an exemplary embodiment, the first adhesive line 121 may extend parallel (e.g., substantially parallel) to the rolling axis FX. In other words, an included angle formed between the first adhesive line 121 and the rolling axis FX may be substantially about 0 degrees. The second adhesive line 122 may form an acute angle (e.g., an acute angle being an angle less than 90 degrees, such as an angle between 0 degrees and 90 degrees) with the rolling axis FX in a counterclockwise direction. In other words, the second adhesive line 122 may extend from one end of the first adhesive line 121, and may form a first included angle (θ1) less than 90 degrees with the rolling axis FX in a counterclockwise direction. The third adhesive line 123 may form an acute angle with the rolling axis FX in a clockwise direction. In other words, the third adhesive line 123 may extend from another end of the first adhesive line 121, and may form a second included angle (θ2) less than 90 degrees with the rolling axis FX in a clockwise direction.

In an exemplary embodiment, the included angles may be in a range of about 0 degrees to about 30 degrees. For example, the first included angle (θ1) and the second included angle (θ2) may be greater than 0 degrees and less than or equal to about 30 degrees.

A previous adhesive member for a display device may be formed to correspond to an entire surface of the display device. In other words, the previous adhesive member may not be patterned. The previous adhesive member may be formed of the aforementioned pressure sensitive adhesive (PSA), and the pressure sensitive adhesive (PSA) may be a viscoelastic material. The viscoelastic material may have elasticity (e.g., solid characteristics) and viscosity (e.g., liquid characteristics). When mechanical stresses apply to the viscoelastic material, creep deformation in which deformation of the viscoelastic material is continued may occur. When folding, rolling, or bending of a display device is repeated, the creep deformation of the adhesive member may be continued or increased, therefore, deformation of the display device may be continued or increased.

The adhesive member 100 according to an exemplary embodiment of the present disclosure may include the plurality of adhesive lines that are not orthogonal to the rolling axis FX (e.g., included angles formed between the adhesive lines and the rolling axis FX are less than 90 degrees or between 0 degrees and 90 degrees, between 0 degrees and 85 degrees, between 0 degrees and 80 degrees, and between 0 degrees and 75 degrees). When the adhesive member 100 is folded, rolled, or bent along the rolling axis FX, components along the first direction DR1 (parallel (e.g., substantially parallel) to the rolling axis FX) of the adhesive portion 120 may not contribute to the creep deformation, however, components along the second direction DR2 (substantially orthogonal to the rolling axis FX) of the adhesive portion 120 may contribute to the creep deformation. The adhesive lines according to an exemplary embodiment may form included angles less than 90 degrees with the rolling axis FX. Therefore, the components along the second direction DR2 of the adhesive portion 120, which contribute to the creep deformation, may decrease. Thus, the aforementioned creep deformation may be decreased or substantially prevented.

In an exemplary embodiment, a width (W1) of each of the adhesive lines may be in a range of about 10 micrometers (μm) to about 200 μm. When the width of the adhesive line is less than about 10 μm, the adhesion of the adhesive film 110 may be relatively small. Further, when the width of the adhesive line is greater than about 200 μm, the creep deformation of the adhesive film 110 may be relatively large. Thus, when the width of the adhesive line is between about 10 μm and about 200 μm, the adhesive film 110 may provide enough or suitable adhesion, and may decrease or substantially prevent the creep deformation.

In an exemplary embodiment, an area of the adhesive portion 120 may be in a range of about 10% to about 80% of an area (e.g., the total area) of the adhesive film 110. When the area of the adhesive portion 120 is less than about 10% of the area (the total area) of the adhesive film 110, the adhesion of the adhesive film 110 may be relatively small. Further, when the area of the adhesive portion 120 is greater than about 80% of the area (the total area) of the adhesive film 110, the creep deformation of the adhesive film 110 may be relatively large. Thus, when the area of the adhesive portion 120 is between about 10% and about 80% of the area (the total area) of the adhesive film 110, the adhesive film 110 may provide enough adhesion, and may decrease or substantially prevent the creep deformation.

In an exemplary embodiment, the adhesive lines may define the elastic portion 130 (e.g., may define a shape of the elastic portion 130). For example, the first, second, and third adhesive lines 121, 122, and 123 may define the elastic portion 130 (e.g., may define the shape of the elastic portion 130) that is surrounded (e.g., partially surrounded) by the first, second, and third adhesive lines 121, 122, and 123.

The elastic portion 130 may serve to restore the adhesive film 110 in a folded, rolled, or bent state to an unfolded, unrolled, or unbent state. The elastic portion 130 may be formed of an elastomer. For example, the elastic portion 130 may include silicon based adhesives such as polydimethylsiloxane (PDMS).

In an exemplary embodiment, the elastic portion 130 may have a polygonal shape. For example, the elastic portion 130 may have a honeycomb shape as illustrated in FIG. 2.

In an exemplary embodiment, a difference between a refractive index of the adhesive portion 120 and a refractive index of the elastic portion 130 may be less than about 0.1. When the adhesive member 100 is interposed between a display member (e.g., a display panel) and a protective member (e.g., a window) of the display device to attach the protective member to the display member, light emitted from the display member may pass through the adhesive member 100, and may be emitted out of the display device through the protective member. As described above, when the difference between the refractive index of the adhesive portion 120 and the refractive index of the elastic portion 130 is less than about 0.1, distortion of an image may be decreased or substantially prevented.

Figure 3A:
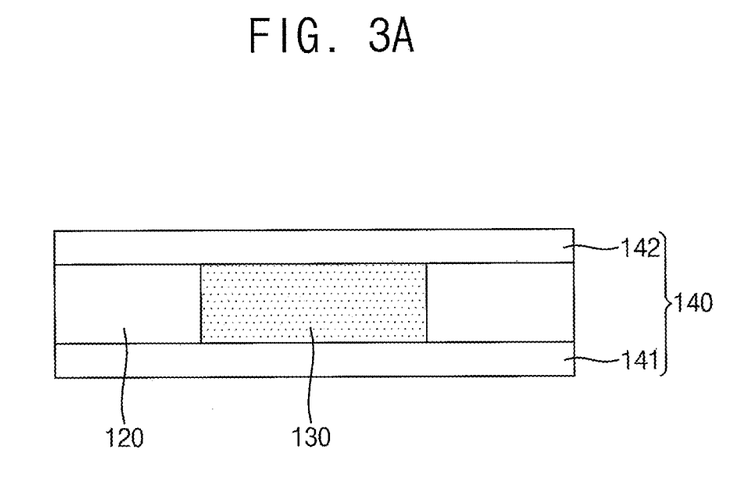
FIGS. 3A-3B are cross-sectional views each illustrating an adhesive member according to an exemplary embodiment.
Figure 3B:
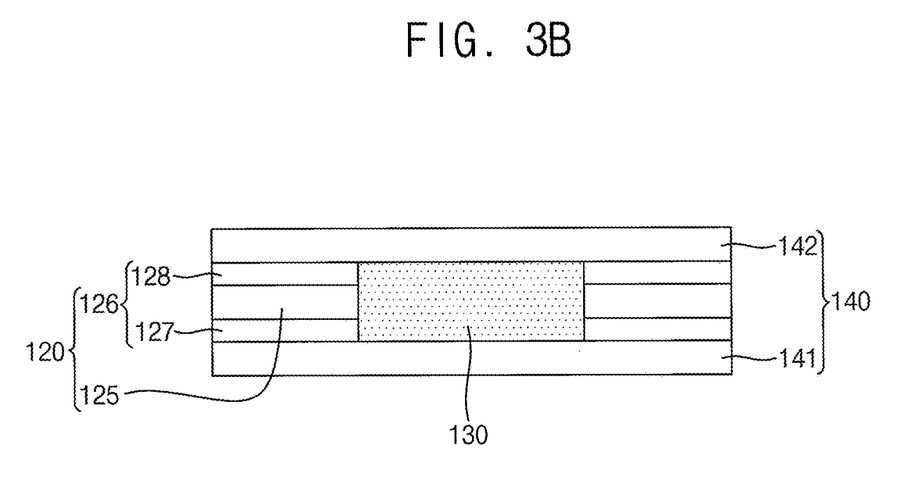

FIGS. 3A-3B are cross-sectional views each illustrating an adhesive member according to an exemplary embodiment. For example, FIGS. 3A-3B may be cross-sectional views cut along a line III-III' in FIG. 2.

Referring to FIG. 3A, the adhesive portion 120 according to an exemplary embodiment may have a single-layered structure. For example, the adhesive portion 120 may be disposed between the lower release film 141 and the upper release film 142.

Referring to FIG. 3B, the adhesive portion 120 according to another exemplary embodiment may have a multi-layered structure. The adhesive portion 120 may include a first adhesive layer 125 and a second adhesive layer 126 disposed between the first adhesive layer 125 and the release film 140. For example, the second adhesive layer 126 may include a second lower adhesive layer 127 disposed between the lower release film 141 and the first adhesive layer 125, and a second upper adhesive layer 128 disposed between the first adhesive layer 125 and the upper release film 142.

The second adhesive layer 126 may have an adhesion greater than an adhesion of the first adhesive layer 125 (e.g., second adhesive layer 126 may be more adhesive than the first adhesive layer 125). The second adhesive layer 126 may directly contact components of the display device disposed on a top surface and/or a bottom surface of the adhesive member 100. Therefore, when the second adhesive layer 126 has an adhesion greater than an adhesion of the first adhesive layer 125, the adhesion of the adhesive member 100 may increase.

An elastic resilience of the first adhesive layer 125 may be greater than an elastic resilience of the second adhesive layer 126. The first adhesive layer 125, that has a relatively high elastic resilience, may be disposed between the second adhesive layers 127 and 128, that have a relatively high adhesion. Thus, the adhesive member 100 in a folded, rolled, or bent state may be easily restored to an unfolded, unrolled, or unbent state, and the creep deformation of the adhesive member 100 may be decreased or substantially prevented.

In an exemplary embodiment, a storage modulus of the first adhesive layer 125 may be in a range of about $1.0 \times 10^4$ to about $1.0 \times 10^6$ at about 25° C., and a loss tangent (tan δ) of the first adhesive layer 125 may be in a range of about 0.3 to about 1.5 at about 25° C. The storage modulus may mean an energy stored without loss by elasticity of material, and a greater storage modulus of a material may mean the material is closer to being a perfect elastic body. A loss modulus may mean an energy lost by viscosity of material, and the loss tangent (tan δ) may correspond to the loss modulus divided by the storage modulus. Thus, a less (or lower) loss tangent (tan δ) of a material may mean the material is close to a perfect elastic body. Therefore, when the first adhesive layer 125 has the aforementioned range of the storage modulus and the loss tangent (tan δ), the first adhesive layer 125 may have excellent elastic characteristics, and the creep deformation of the adhesive member 100 may be decreased or substantially prevented.

Figure 4:
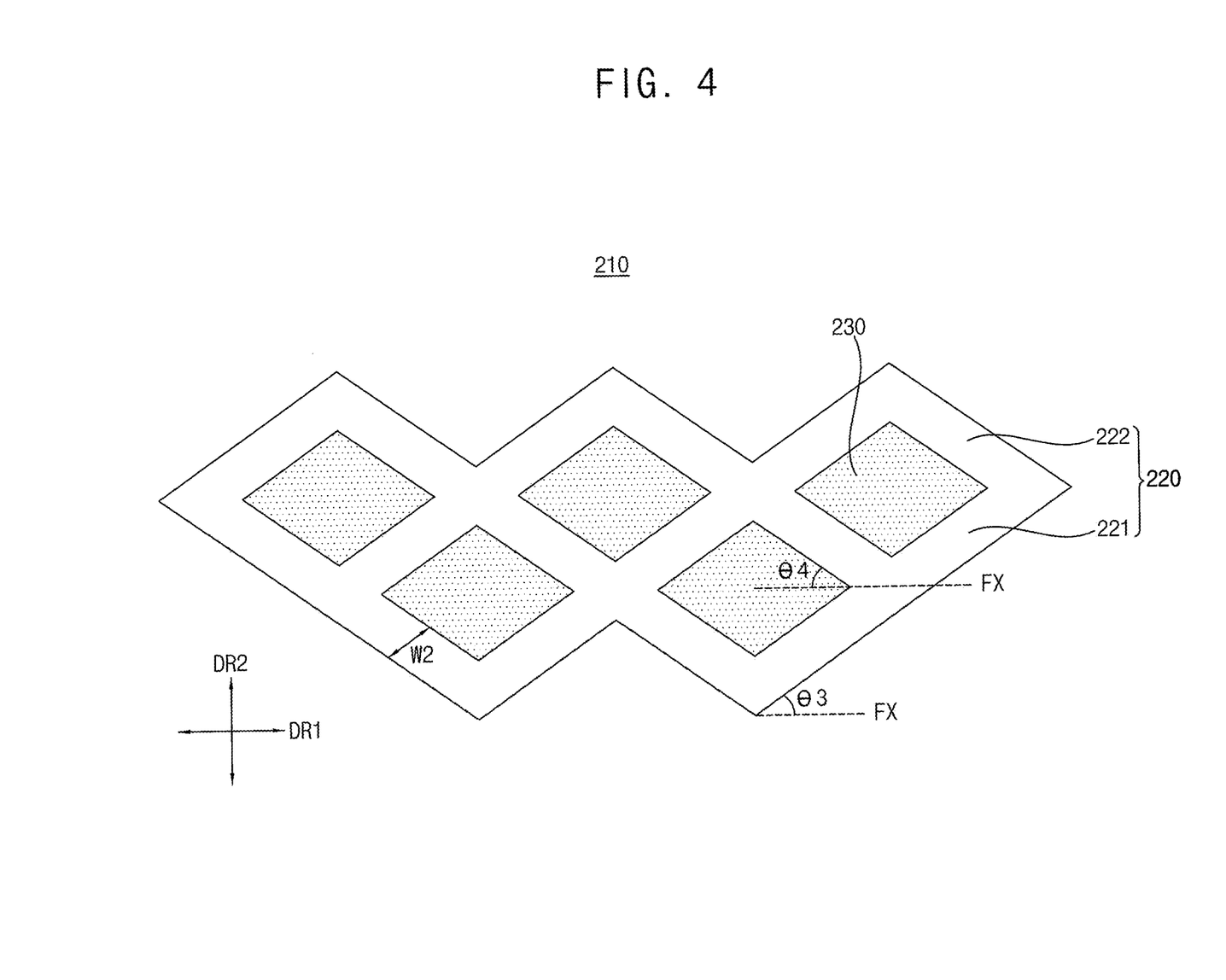
FIG. 4 is a plan view illustrating an adhesive film of an adhesive member according to an exemplary embodiment.

FIG. 4 is a plan view illustrating an adhesive film of an adhesive member according to an exemplary embodiment.

Referring to FIG. 4, an adhesive film 210 may include an adhesive portion 220 and an elastic portion 230. The adhesive film 210 may include one or more adhesive portions 220 and one or more elastic portions 230.

The adhesive portion 220 may include a plurality of adhesive lines. The adhesive lines may extend along directions different from each other. Included angles formed between the adhesive lines and the rolling axis FX may be less than 90 degrees. In other words, the adhesive lines may not be orthogonal to the rolling axis FX. The adhesive lines may extend along a first direction DR1 parallel (e.g., substantially parallel) to the rolling axis FX, or may extend along a set or predetermined direction between the first direction DR1 and a second direction DR2, the second direction DR2 being orthogonal or substantially orthogonal to the rolling axis FX. However, the adhesive lines may not extend along the second direction DR2.

In an exemplary embodiment, the adhesive film 210 may include a plurality of adhesive portions 220 each including a plurality of adhesive lines. Each adhesive portion 220 may share at least one adhesive line with at least one adjacent adhesive portion 220.

In an exemplary embodiment, the adhesive portion 220 may include a first adhesive line 221 and a second adhesive line 222. The first adhesive line 221 may extend from an end of the second adhesive line 222. The second adhesive line 222 may extend from an end of the first adhesive line 221.

In an exemplary embodiment, the adhesive portion 220 may include four adhesive lines. For example, the adhesive portion 220 may include two first adhesive lines 221 opposite to each other and two second adhesive lines 222 opposite to each other. Thus, a diamond shape may be formed inside the adhesive portion 220 surrounded (e.g., partially surrounded) by the four adhesive lines. For example, two adhesive portions 220 adjacent to each other may share one adhesive line.

Included angles formed between the first and second adhesive lines 221 and 222, and the rolling axis FX may be less than 90 degrees (e.g., between 0 degrees and 90 degrees, between 0 degrees and 85 degrees, between 0 degrees and 80 degrees, and between 0 degrees and 75 degrees). In other words, the first and second adhesive lines 221 and 222 may not be orthogonal to the rolling axis FX. In an exemplary embodiment, the first adhesive line 221 may form an acute angle with the rolling axis FX in a counterclockwise direction. In other words, the first adhesive line 221 may extend from an end of the second adhesive line 221, and may form a third included angle (θ3) less than 90 degrees with the rolling axis FX in a counterclockwise direction. The second adhesive line 222 may form an acute angle with the rolling axis FX in a clockwise direction. In other words, the second adhesive line 222 may extend from an end of the first adhesive line 221, and may form a fourth included angle (θ4) less than 90 degrees with the rolling axis FX in a clockwise direction.

In an exemplary embodiment, the included angles may be in a range of about 0 degrees to about 30 degrees. For example, the third included angle (θ3) and the fourth included angle (θ4) may be greater than 0 degrees and less than or equal to about 30 degrees.

In an exemplary embodiment, a width (W2) of each of the adhesive lines may be in a range of about 10 μm to about 200 μm. When the width of the adhesive line is less than about 10 μm, the adhesion of the adhesive film 210 may be relatively small. Further, when the width of the adhesive line is greater than about 200 μm, the creep deformation of the adhesive film 210 may be relatively large. Thus, when the width of the adhesive line is between about 10 μm and about 200 μm, the adhesive film 210 may provide enough adhesion, and may decrease or substantially prevent the creep deformation.

In an exemplary embodiment, the adhesive lines may define the elastic portion 230 (e.g., may define a shape of the elastic portion 230). For example, the first and second adhesive lines 221 and 222 may define the elastic portion 230 (e.g., may define the shape of the elastic portion 230) that is surrounded (e.g., partially surrounded) by the first and second adhesive lines 221 and 222.

In an exemplary embodiment, the elastic portion 230 may have a polygonal shape. For example, the elastic portion 230 may have a diamond shape as illustrated in FIG. 4.

Figure 5:
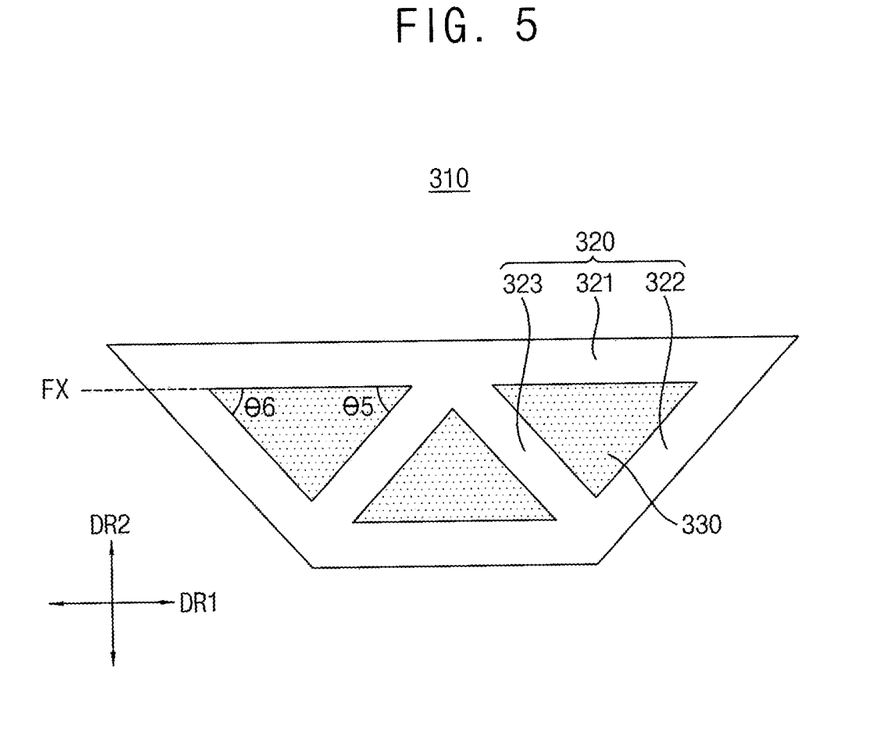
FIG. 5 is a plan view illustrating an adhesive film of an adhesive member according to an exemplary embodiment.

FIG. 5 is a plan view illustrating an adhesive film of an adhesive member according to an exemplary embodiment.

Referring to FIG. 5, an adhesive film 310 may include an adhesive portion 320 and an elastic portion 330. The adhesive film 310 may include one or more adhesive portions 320 and one or more elastic portions 330.

The adhesive portion 320 may include a plurality of adhesive lines. The adhesive lines may extend along directions different from each other. Included angles formed between the adhesive lines and the rolling axis FX may be less than 90 degrees. In other words, the adhesive lines may not be orthogonal to the rolling axis FX. The adhesive lines may extend along a first direction DR1 parallel (e.g., substantially parallel) to the rolling axis FX, or may extend along a set or predetermined direction between the first direction DR1 and a second direction DR2, the second direction DR2 being orthogonal or substantially orthogonal to the rolling axis FX. However, the adhesive lines may not extend along the second direction DR2.

In an exemplary embodiment, the adhesive film 310 may include a plurality of adhesive portions 320 each including a plurality of adhesive lines. Each adhesive portion 320 may share at least one adhesive line with at least one adjacent adhesive portion 320.

In an exemplary embodiment, the adhesive portion 320 may include a first adhesive line 321, a second adhesive line 322, and a third adhesive line 323. The second adhesive line 322 may extend from one end of the first adhesive line 321. The third adhesive line 323 may extend from another end of the first adhesive line 321.

In an exemplary embodiment, the adhesive portion 320 may include three adhesive lines. For example, the adhesive portion 320 may include one first adhesive line 321, one second adhesive line 322, and one third adhesive line 323. Thus, a triangle shape may be formed inside the adhesive portion 320 surrounded (e.g., partially surrounded) by the three adhesive lines. For example, two adhesive portions 320 adjacent to each other may share one adhesive line.

Included angles formed between the first, second, and third adhesive lines 321, 322, and 323, and the rolling axis FX may be less than 90 degrees. In other words, the first, second, and third adhesive lines 321, 322, and 323 may not be orthogonal to the rolling axis FX. In an exemplary embodiment, the first adhesive line 321 may extend parallel (e.g., substantially parallel) to the rolling axis FX. In other words, an included angle formed between the first adhesive line 321 and the rolling axis FX may be substantially about 0 degrees. The second adhesive line 322 may form an acute angle with the rolling axis FX in a counterclockwise direction. In other words, the second adhesive line 322 may extend from one end of the first adhesive line 321, and may form a fifth included angle ($\theta 5$) less than 90 degrees (or between 0 degrees and 90 degrees, between 0 degrees and 85 degrees, between 0 degrees and 80 degrees, and between 0 degrees and 75 degrees) with the rolling axis FX in a counterclockwise direction. The third adhesive line 323 may form an acute angle with the rolling axis FX in a clockwise direction. In other words, the third adhesive line 323 may extend from another end of the first adhesive line 321, and may form a sixth included angle ($\theta 6$) less than 90 degrees (or between 0 degrees and 90 degrees, between 0 degrees and 85 degrees, between 0 degrees and 80 degrees, and between 0 degrees and 75 degrees) with the rolling axis FX in a clockwise direction.

In an exemplary embodiment, the included angles may be in a range of about 0 degrees to about 30 degrees. For example, the fifth included angle ($\theta 5$) and the sixth included angle ($\theta 6$) may be greater than 0 degrees and less than or equal to about 30 degrees.

In an exemplary embodiment, the adhesive lines may define the elastic portion 330 (e.g., may define a shape of the elastic portion 330). For example, the first, second, and third adhesive lines 321, 322, and 323 may define the elastic portion 330 (e.g., may define the shape of the elastic portion 330) that is surrounded (e.g., partially surrounded) by the first, second, and third adhesive lines 321, 322, and 323.

In an exemplary embodiment, the elastic portion 330 may have a polygonal shape. For example, the elastic portion 330 may have a triangle shape as illustrated in FIG. 5.

Figure 6:
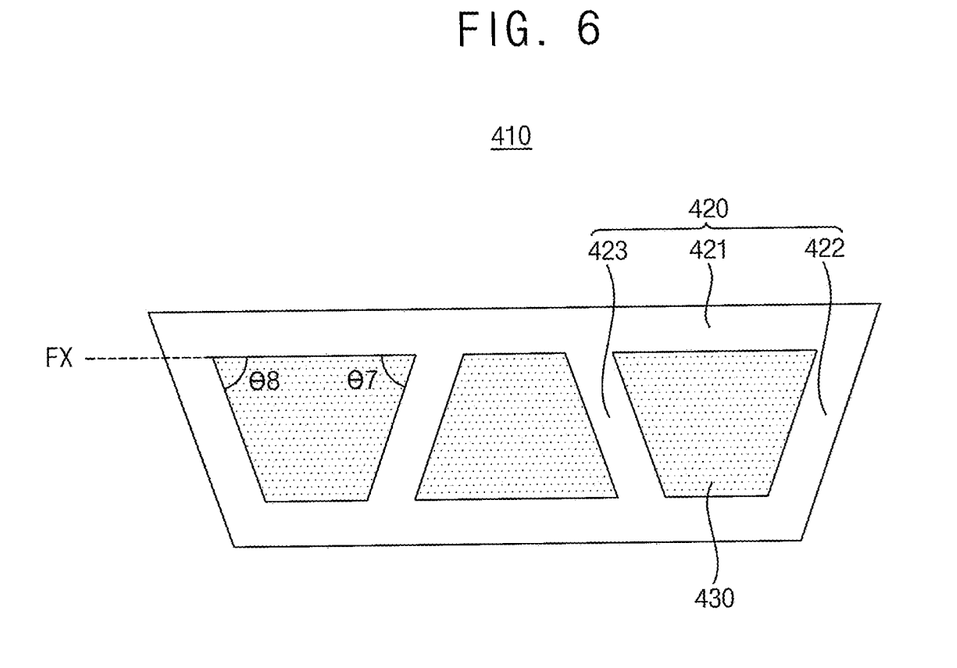
FIG. 6 is a plan view illustrating an adhesive film of an adhesive member according to an exemplary embodiment.

FIG. 6 is a plan view illustrating an adhesive film of an adhesive member according to an exemplary embodiment.

Referring to FIG. 6, an adhesive film 410 may include an adhesive portion 420 and an elastic portion 430. The adhesive film 410 may include one or more adhesive portions 420 and one or more elastic portions 430.

The adhesive portion 420 may include a plurality of adhesive lines. The adhesive lines may extend along directions different from each other. Included angles formed between the adhesive lines and the rolling axis FX may be less than 90 degrees (or between 0 degrees and 90 degrees, between 0 degrees and 85 degrees, between 0 degrees and 80 degrees, and between 0 degrees and 75 degrees). In other words, the adhesive lines may not be orthogonal to the rolling axis FX. The adhesive lines may extend along a first direction DR1 parallel (e.g., substantially parallel) to the rolling axis FX, or may extend along a set or predetermined direction between the first direction DR1 and a second direction DR2, the second direction DR2 being orthogonal or substantially orthogonal to the rolling axis FX. However, the adhesive lines may not extend along the second direction DR2.

In an exemplary embodiment, the adhesive film 410 may include a plurality of adhesive portions 420 each including a plurality of adhesive lines. Each adhesive portion 420 may share at least one adhesive line with at least one adjacent adhesive portion 420.

In an exemplary embodiment, the adhesive portion 420 may include a first adhesive line 421, a second adhesive line 422, and a third adhesive line 423. The second adhesive line 422 may extend from one end of the first adhesive line 421. The third adhesive line 423 may extend from another end of the first adhesive line 421.

In an exemplary embodiment, the adhesive portion 420 may include four adhesive lines. For example, the adhesive portion 420 may include two first adhesive lines 421 opposite to each other, one second adhesive line 422, and one third adhesive line 423. Thus, a trapezoid shape may be formed inside the adhesive portion 420 surrounded (e.g., partially surrounded) by the four adhesive lines. For example, two adhesive portions 420 adjacent to each other may share one adhesive line.

Included angles formed between the first, second, and third adhesive lines 421, 422, and 423, and the rolling axis FX may be less than 90 degrees (or between 0 degrees and 90 degrees, between 0 degrees and 85 degrees, between 0 degrees and 80 degrees, and between 0 degrees and 75 degrees). In other words, the first, second, and third adhesive lines 421, 422, and 423 may not be orthogonal to the rolling axis FX. In an exemplary embodiment, the first adhesive line 421 may extend parallel (e.g., substantially parallel) to the rolling axis FX. In other words, an included angle formed between the first adhesive line 421 and the rolling axis FX may be substantially about 0 degrees. The second adhesive line 422 may form an acute angle with the rolling axis FX in a counterclockwise direction. In other words, the second adhesive line 422 may extend from one end of the first adhesive line 421, and may form a seventh included angle (θ7) less than 90 degrees (or between 0 degrees and 90 degrees) with the rolling axis FX in a counterclockwise direction. The third adhesive line 423 may form an acute angle with the rolling axis FX in a clockwise direction. In other words, the third adhesive line 423 may extend from another end of the first adhesive line 421, and may form an eighth included angle (θ8) less than 90 degrees (or between 0 degrees and 90 degrees) with the rolling axis FX in a clockwise direction.

In an exemplary embodiment, the included angles may be in a range of about 0 degrees to about 30 degrees. For example, the seventh included angle (θ7) and the eighth included angle (θ8) may be greater than 0 degrees and less than or equal to about 30 degrees.

In an exemplary embodiment, the adhesive lines may define the elastic portion 430 (e.g., may define a shape of the elastic portion 430). For example, the first, second, and third adhesive lines 421, 422, and 423 may define the elastic portion 430 (e.g., may define the shape of the elastic portion 430) that is surrounded (e.g., partially surrounded) by the first, second, and third adhesive lines 421, 422, and 423.

In an exemplary embodiment, the elastic portion 430 may have a polygonal shape. For example, the elastic portion 430 may have a trapezoid shape as illustrated in FIG. 6.

Hereinafter, exemplary embodiments will be described in more detail with reference to experimental results. The example embodiments below are for explanation and illustration purposes, and are not for limiting the scope of the present invention.

Figure 7:
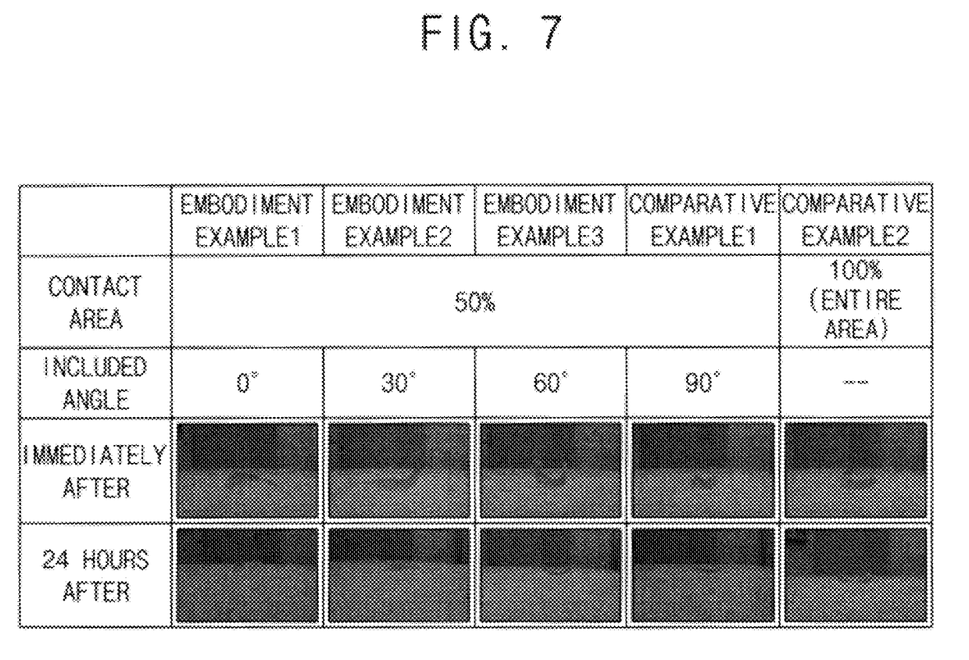
FIG. 7 is a table including images illustrating adhesive members according to embodiment examples and comparative examples.

FIG. 7 is a table including images illustrating adhesive members according to embodiment examples and comparative examples.

FIG. 7 illustrates experimental results from observing creep deformation of an adhesive member according to embodiment examples and comparative examples. FIG. 7 illustrates experimental results from observing creep deformation of an adhesive member with changing an included angle formed between an adhesive line of the adhesive member and a rolling axis. For example, the included angle may be about 0 degrees in a first embodiment example, the included angle may be about 30 degrees in a second embodiment example, the included angle may be about 60 degrees in a third embodiment example, and the included angle may be about 90 degrees in a first comparative example. Further, an adhesive film is not patterned, and the adhesive film is formed on an entire surface of a release film in a second comparative example. Experiments observing a rolling degree of the adhesive member as time passes are performed. To draw experimental results, the adhesive member originally rolled to a lower direction (e.g., a bottom surface of the adhesive member is concave) is rolled to an upper direction (e.g., a top surface of the adhesive member is concave). For the experiments, a structure including a lower release film having about 30 μm thickness, an adhesive film having about 50 μm thickness, and an upper release film having about 30 μm thickness, which corresponds to the adhesive member according to exemplary embodiments of the present disclosure is disposed on a hard-coated layer having about 30 μm thickness. Here, a radius of curvature of the adhesive member rolled to the upper direction is about 5 millimeters (mm), and the adhesive member may be rolled to the lower direction before being rolled to the upper direction.

Referring to FIG. 7, the adhesive member is restored to an original state (rolled to the lower direction) immediately after being rolled to the upper direction, and maintains the restored state after 24 hours in the first embodiment example. The adhesive member is deformed to a substantially flat state after 24 hours in the second embodiment example. The adhesive member is rolled to the upper direction after 24 hours, however, a rolling degree of the adhesive member after 24 hours is less than a rolling degree of the adhesive member immediately after being rolled to the upper direction in the third embodiment example. The adhesive member remains being rolled to the upper direction after 24 hours in the first comparative example. There is no particular or substantial difference between the adhesive member after 24 hours and the adhesive member immediately after being rolled to the upper direction in the second comparative example.

Based on the experimental results, degrees of restoration of the adhesive member in the embodiment examples are greater than degrees of restoration of the adhesive member in the comparative examples. For example, degrees of restoration of the adhesive member are relatively great when the included angle is about 0 degrees (in the first embodiment example) and about 30 degrees (in the second embodiment example). Therefore, the creep deformation of the adhesive member according the embodiment examples may be decreased or substantially prevented in comparison to the comparative examples.

Figure 8:
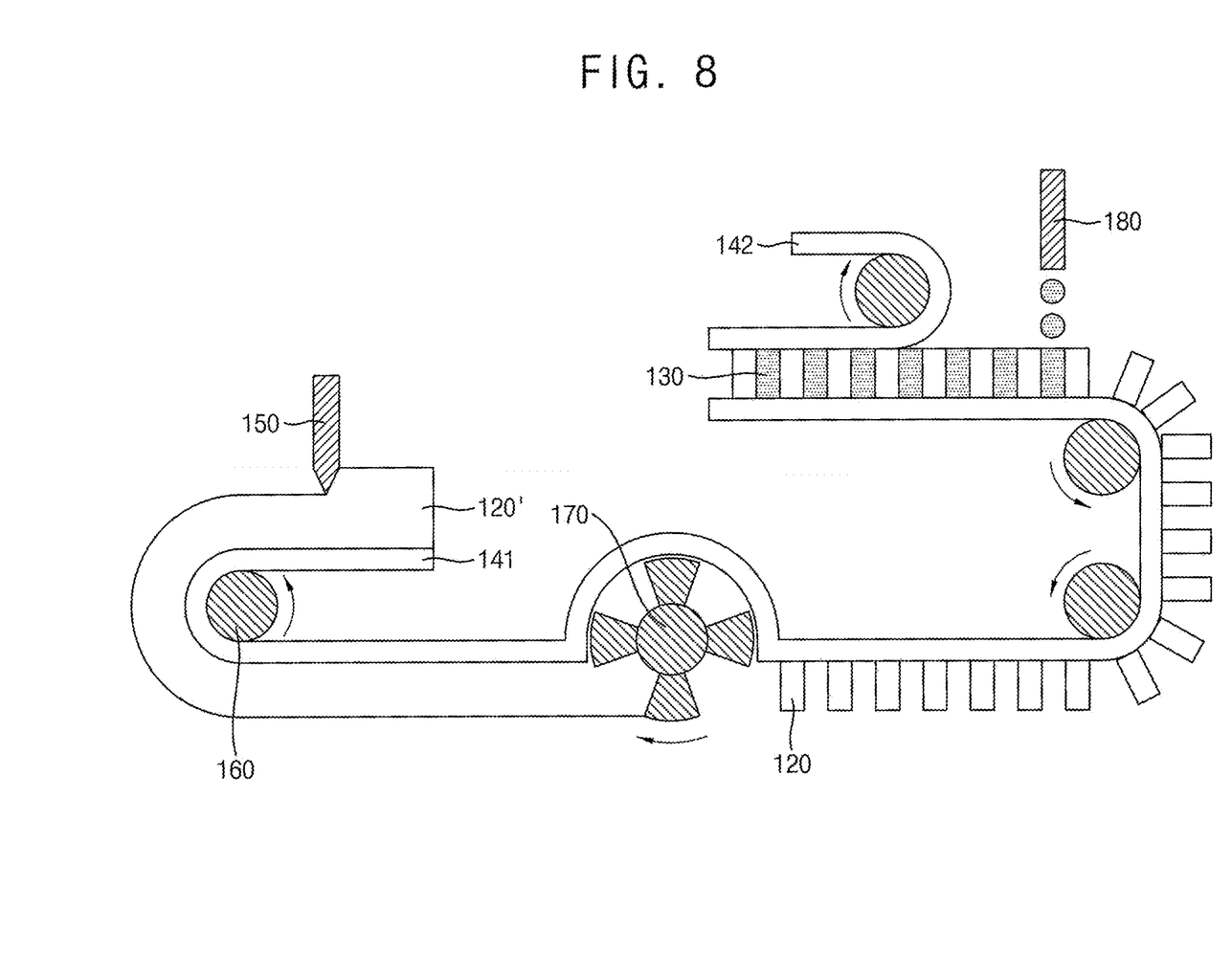
FIG. 8 is a diagram illustrating a method of manufacturing an adhesive member according to an exemplary embodiment.

FIG. 8 is a diagram illustrating a method of manufacturing an adhesive member according to an exemplary embodiment.

Referring to FIG. 8, an adhesive 120' may be applied on one surface of the lower release film 141. The lower release film 141 on which the adhesive 120' is applied may be moved using a transferring roller 160 such as a conveyer system. A thickness control device 150 may be used to form a thickness of the adhesive 120' to be uniformly or substantially uniformly sized. The adhesive portion 120 may be formed via a roll-to-roll process using a molding roller 170. A molding pattern may be formed on the molding roller 170 corresponding to the adhesive portion 120. The adhesive 120' may be patterned by using the molding pattern to form the adhesive portion 120. The adhesive portion 120 may include the plurality of adhesive lines as illustrated in FIGS. 2, 4, 5, and 6. The adhesive 120' may be patterned and hardened concurrently or simultaneously. The adhesive 120' may be hardened using heat or ultra-violet (UV) rays.

An elastic material such as an elastomer may be applied on the lower release film 141 on which the adhesive portion 120 is formed using an applying device 180. A space may be formed by removing the adhesive 120' on the lower release film 141, and the space may be surrounded (e.g., partially surrounded) by the plurality of adhesive lines of the adhesive portion 120. The space may be filled by the elastic material to form the elastic portion 130. Here, the elastic material may be hardened to form the elastic portion 130 after applying the elastic material. The upper release film 142 may be attached to the lower release film 141 on which the adhesive portion 120 and the elastic portion 130 are formed to face the lower release film 141.

Figure 9A:
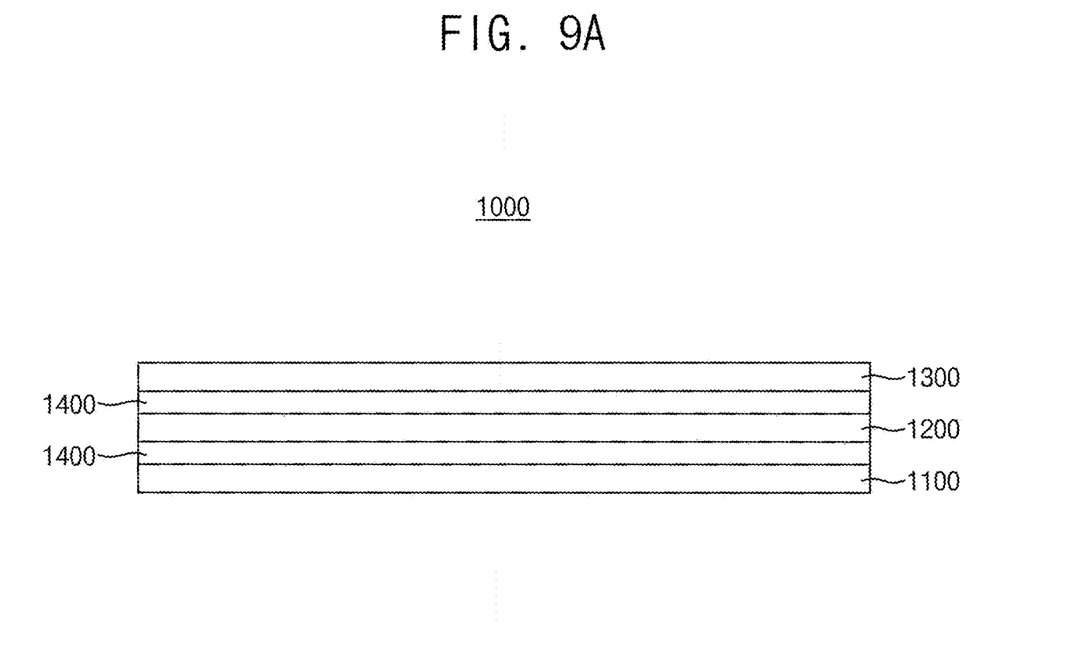
FIGS. 9A-9B are side views illustrating a display device according to an exemplary embodiment.
Figure 9B:
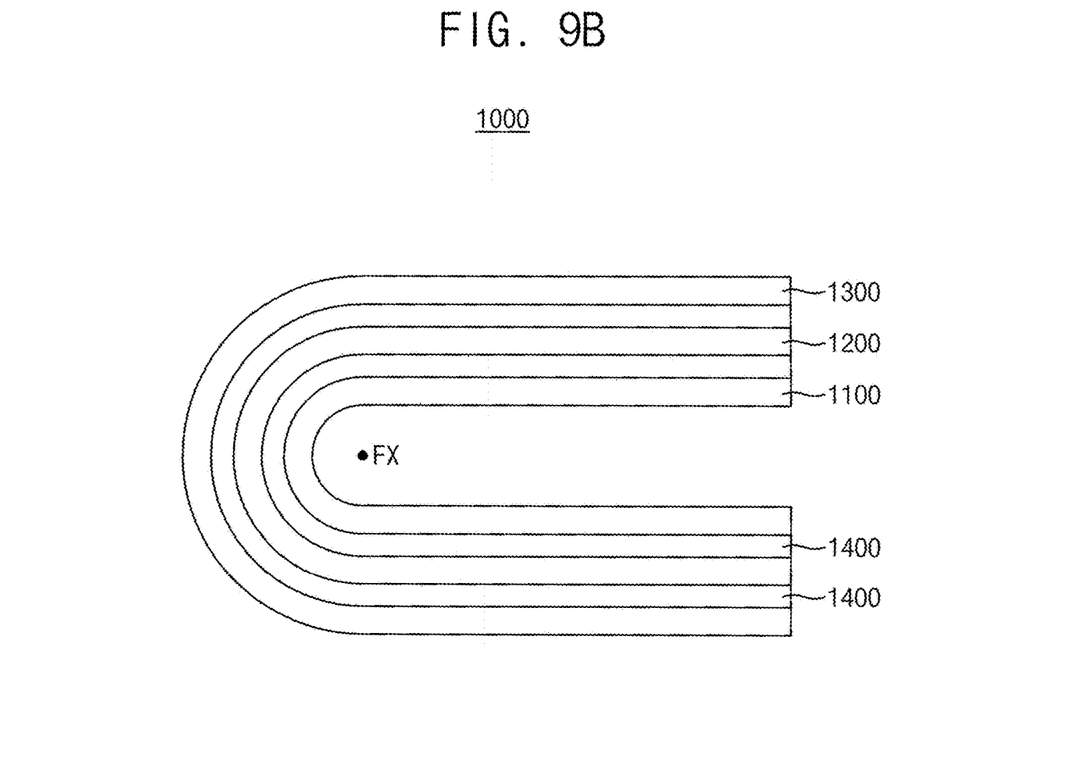

FIGS. 9A-9B are side views illustrating a display device according to an exemplary embodiment. For example, FIG. 9A illustrates an unrolled display device, and FIG. 9B illustrates a rolled display device.

Referring to FIGS. 9A-9B, a display device 1000 according to an exemplary embodiment may include a display member 1100, a functioning member 1200, a protective member 1300, and an adhesive member 1400.

The display member 1100 may display an image. For example, the display member 1100 may include a display panel such as an organic light emitting display (OLED) panel, a liquid crystal display (LCD) panel, or the like.

The functioning member 1200 may be disposed on the display member 1100. The functioning member 1200 may include a polarizing member decreasing or substantially preventing a reflection of incident light, a touch sensing member sensing a position or a magnitude of touch input, or the like.

The protective member 1300 may be disposed on the functioning member 1200. The protective member 1300 may protect the display member 110 from external impact. The protective member 1300 may be formed of a glass, a plastic, etc. For example, when the display device 1000 has flexible characteristics, the protective member 1300 may include a plastic formed of polyethylene terephthalate (PET), polycarbonate (PC), polyimide (PI), polymethyl methacrylate (PMMA), and/or thermoplastic polyurethane.

The adhesive member 1400 may be disposed between components of the display device 1000. For example, the adhesive member 1400 may be interposed between the display member 1100 and the functioning member 1200, and/or between the functioning member 1200 and the protective member 1300. The adhesive member 1400 may have adhesion (e.g., may be adhesive). Therefore, the adhesive member 1400 may serve to attach the components of the display device 1000 to each other.

The adhesive member 1400 may correspond to the adhesive film 110, 210, 310, and 410 of the adhesive member 100 according to exemplary embodiments, or may correspond to the adhesive member 100 according to exemplary embodiments. Therefore, when the display device 1000 is folded, rolled, or bent, the creep deformation of the display device 1000 may be reduced, and the folded, rolled, or bent display device 1000 may be relatively easily restored to an unfolded, unrolled, or unbent state.

The adhesive member according to exemplary embodiments of the present disclosure may be applied to a display device included in a computer, a notebook, a mobile phone, a smartphone, a smart pad, a portable media player (PMP), a personal digital assistant (PDA), an MP3 player, or the like.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Although the adhesive members and the display devices including the adhesive members according to the exemplary embodiments of the present disclosure have been described with reference to the drawings, the illustrated embodiments are examples, and may be modified and changed by a person having ordinary knowledge in the relevant technical field without departing from the technical spirit of the present disclosure described in the following claims, and equivalents thereof.

What is claimed is:

1. A display device, comprising:
   a display member configured to roll along a rolling axis;
   an adhesive member disposed on the display member, the adhesive member comprising an adhesive portion comprising a plurality of adhesive lines; and
   a protective member disposed on the adhesive member,
   wherein the display device is an electronic display device,
   wherein the plurality of adhesive lines are not orthogonal to the rolling axis,
   wherein the display member is capable of displaying an image,
   wherein the plurality of adhesive lines define an elastic portion that is between respective ones of the adhesive lines,
   wherein the elastic portion comprises a silicon based adhesive,
   wherein a difference between a refractive index of the adhesive portion and a refractive index of the elastic portion is less than 0.1,
   wherein the adhesive portion comprises a first adhesive layer between a second lower adhesive layer and a second upper adhesive layer, the second lower adhesive layer and the second upper adhesive layer each having an adhesion greater than an adhesion of the first adhesive layer, and
   wherein an elastic resilience of the first adhesive layer is greater than an elastic resilience of each of the second lower adhesive layer and the second upper adhesive layer.

2. The display device of claim 1, wherein included angles between the plurality of adhesive lines and the rolling axis are in a range of 0 degrees to 30 degrees.

3. The display device of claim 1, wherein an area of the adhesive portion is in a range of 10% to 80% of an area of the adhesive member.

4. The display device of claim 1, wherein the adhesive portion comprises a pressure sensitive adhesive (PSA).

5. The display device of claim 1, wherein a width of each of the plurality of adhesive lines is in a range of 10 micrometers (μm) to 200 μm.

6. The display device of claim 1, wherein the elastic portion has a polygonal shape.

7. The display device of claim 6, wherein the silicon based adhesive is an elastomer.

8. The display device of claim 1, wherein each of the plurality of adhesive lines comprises:
   a first adhesive line parallel with the rolling axis;
   a second adhesive line that forms an acute angle with the rolling axis in a counterclockwise direction; and
   a third adhesive line that forms an acute angle with the rolling axis in a clockwise direction, and
   wherein the first adhesive line, the second adhesive line, and the third adhesive line define the elastic portion that is between respective ones of the first adhesive line, the second adhesive line, and the third adhesive line.

9. The display device of claim 8, wherein the elastic portion has a honeycomb shape, a triangle shape, or a trapezoid shape.

10. The display device of claim 1, wherein each of the plurality of adhesive lines comprises:
    a first adhesive line that forms an acute angle with the rolling axis in a counterclockwise direction; and
    a second adhesive line that forms an acute angle with the rolling axis in a clockwise direction, and
    wherein the first adhesive line and the second adhesive line define the elastic portion that is between the first adhesive line and the second adhesive line.

11. The display device of claim 10, wherein the elastic portion has a diamond shape.

12. The display device of claim 1, wherein a storage modulus of the first adhesive layer is in a range of $1.0 \times 10^4$ to $1.0 \times 10^6$ at 25° C., and
    wherein a loss tangent of the first adhesive layer is in a range of 0.3 to 1.5 at 25° C.

13. The display device of claim 1, wherein an adhesion of the adhesive portion is in a range of 0.3 kgf/in to 1.5 kgf/in.

* * * * *